(12) United States Patent
Bredholt et al.

(10) Patent No.: US 8,487,624 B2
(45) Date of Patent: Jul. 16, 2013

(54) SURFACE SENSOR

(75) Inventors: Geir Ivar Bredholt, Oslo (NO); Ralph W. Bernstein, Hosle (NO); Nicolai W. Christie, Hosle (NO); Anders Natas, Oslo (NO); Oyvind Slogedal, Hosle (NO)

(73) Assignee: IDEX ASA, Fornebu (NO)

( * ) Notice: Subject to any disclaimer, the term of this patent is extended or adjusted under 35 U.S.C. 154(b) by 317 days.

(21) Appl. No.: 13/060,759

(22) PCT Filed: Sep. 1, 2009

(86) PCT No.: PCT/EP2009/061260
§ 371 (c)(1),
(2), (4) Date: Mar. 22, 2011

(87) PCT Pub. No.: WO2010/023323
PCT Pub. Date: Mar. 4, 2010

(65) Prior Publication Data
US 2011/0182488 A1    Jul. 28, 2011

(30) Foreign Application Priority Data
Sep. 1, 2008 (NO) .................................. 20083766

(51) Int. Cl.
*G01V 3/00* (2006.01)
(52) U.S. Cl.
USPC .......................................... 324/322; 324/300
(58) Field of Classification Search
USPC .................... 324/300–322; 600/407–445
See application file for complete search history.

(56) References Cited

U.S. PATENT DOCUMENTS 5,515,298 A * 5/1996 Bicz .............................. 702/167
5,963,679 A   10/1999 Setlak
(Continued)

FOREIGN PATENT DOCUMENTS
EP    0779497 A2    6/1997
EP    1256899 A1    11/2002
(Continued)

OTHER PUBLICATIONS

Bauer, Tomas, First High Volume Via Process for Packaging and Integration of MEMS / CMOS, Silex Microsystems, 6 pages.
(Continued)

*Primary Examiner* — Brij Shrivastav
(74) *Attorney, Agent, or Firm* — Winstead PC

(57) ABSTRACT

The invention relates to a sensor for measuring structures in a surface, e.g. a fingerprint sensor comprising a chosen number of sensor elements at chosen positions for coupling to a finger surface having a size less or comparable to the size of the structures in the finger surface, and a processing unit including interrogation electrodes coupled to said sensor elements for providing impedance measurements at said finger surface, the processing unit being mounted on one side of a substrate and the sensor elements being positioned on the opposite side of said substrate, the substrate including through going first conducting leads between said sensor elements and said interrogation electrodes. The substrate is made from a semiconductor material such as silicon and said first conducting leads are constituted by through going substrate sections of a chosen size surrounded by an insulating dielectric separating them from the substrate.

19 Claims, 3 Drawing Sheets

U.S. PATENT DOCUMENTS

| | | | |
|---|---|---|---|
| 6,289,114 B1 | 9/2001 | Mainguet | |
| 6,512,381 B2 | 1/2003 | Kramer | |
| 6,628,812 B1 | 9/2003 | Setlak et al. | |
| 6,683,971 B1 | 1/2004 | Salatino et al. | |
| 6,838,362 B2 | 1/2005 | Mastromatteo et al. | |
| 7,054,471 B2 | 5/2006 | Tschudi | |
| 7,110,577 B1 | 9/2006 | Tschudi | |
| 7,129,926 B2 | 10/2006 | Mathiassen et al. | |
| 7,184,581 B2 | 2/2007 | Johansen et al. | |
| 7,227,213 B2 | 6/2007 | Mastromatteo et al. | |
| 7,251,351 B2 | 7/2007 | Mathiassen et al. | |
| 7,308,121 B2 | 12/2007 | Mathiassen et al. | |
| 7,848,798 B2 * | 12/2010 | Martinsen et al. | 600/547 |
| 8,195,285 B2 * | 6/2012 | Martinsen et al. | 600/547 |
| 2005/0101054 A1 | 5/2005 | Mastromatteo et al. | |

FOREIGN PATENT DOCUMENTS

| | | |
|---|---|---|
| EP | 1286298 A2 | 2/2003 |
| EP | 1316913 A2 | 6/2003 |
| WO | WO-01/99035 A2 | 12/2001 |
| WO | WO-03/049012 A2 | 6/2003 |
| WO | WO-2004049942 A1 | 6/2004 |
| WO | WO-2004/084300 A1 | 9/2004 |
| WO | WO-2007/089207 A1 | 8/2007 |

OTHER PUBLICATIONS

Isa, Sabine, "International Search Report", for PCT/EP2009/061260 as mailed Dec. 4, 2009, 3 pages.

* cited by examiner

SURFACE SENSOR

The present invention relates to a sensor for measuring and imaging structures in a surface, especially a fingerprint sensor, comprising a chosen number of sensor elements at chosen positions for coupling to a finger surface having a size comparable to the size of the structures in the finger surface. More specifically the invention relates to a fingerprint sensor based on a silicon substrate having through going conducting paths and a processing unit constituted by an electronic circuitry at the opposite side of the substrate from the sensor elements being coupled to the finger surface.

In the recent years biometrics, and especially fingerprint sensors, have become common for the purpose of verifying the identity of a person, e.g. at immigration control, at airports as well as with personal devices such as laptops etc. The present solutions still have a number of disadvantages both in use and in production. The fingerprint sensors used in airports and immigration control are large and too expensive for many applications, while the stripe shaped fingerprint sensors known in some laptop computers and handheld devices have the disadvantage that the production techniques for the sensors requires that they are positioned in a recess in the shell of the product. This is unpractical and puts limitation to the functionality and esthetical design of the product. Also, by requiring that the user presses his finger into the recess while moving it, dirt is left inside the recess which may reduce the quality of the scanned image.

A fingerprint sensor which may be positioned in the same plane as the surface of the product it is mounted into is described in U.S. Pat. No. 7,251,351, in which sensor elements are positioned on one side of an insulating substrate provided with through substrate via conductors. The substrate may be made from glass, ceramics and other insulating materials an although it is mentioned that silicon may be used as a substrate this is said to have the disadvantage that the material may be conducting and thus the conductors have to be insulated from the substrate, with a potentially complicated production process as a result.

Another solution is the single chip solution discussed in US application US 2005/0101054 and U.S. Pat. No. 7,184,581 where electronic circuitry is made in the substrate. This also requires complex production methods and a need to change the whole production if the circuitry related to the measuring and processing unit or the layout of the fingerprint sensor element positions have to be changed.

Thus it is an object of the present invention to offer a fingerprint sensor realized by well established high volume, low cost semiconductor manufacturing processes, while also allowing the sensor surface can be positioned flush with the surface of the object in which it is mounted. The invention ensures a flexible sensor production in the way that the same sensor substrate could be provided with different processing units and vice versa. This is accomplished with a fingerprint sensor as stated above being characterized as described in the independent claims.

The fingerprint sensor is thus produced using a silicon wafer being prepared with through wafer conducting leads, having sensor elements for coupling to the finger on one side and with the processing unit well protected on the opposite side. One production method of such silicon wafer is per se known from international patent applications WO2004/084300 and WO2007/089207 and will not be discussed in detail here, but the application of this or similar production methods provide advantages in the flexibility of preparing the sensor, for example by doping e.g. for provided a chosen conductivity in the vias/conductor leads, by drilled or etched insulated via holes filled with conducting material or by adding some circuitry directly to the silicon substrate. The method described in WO2007/089207 allows for separating silicon substrate areas of a chosen size by insulating trenches with a typical width of 10-20 µm. Other possible production methods are discussed in U.S. Pat. No. 7,227,213 and U.S. Pat. No. 6,838,362, as well as the abovementioned US 2005/0101054, where the via holes are use for connecting to circuitry in the substrate.

In the following text the term impedance is used to describe the measured characteristic of the finger. This will in practice be understood by a person skilled in the art as the result of a voltage and/or current measurement in the processing unit and calculating fingerprint structure from this. Also, the term coupling is understood as including both direct electrical contact between two parts and capacitive coupling of the two parts through an insulator.

The invention will be discussed more in detail below with reference to the accompanying drawings, illustrating the invention by way of examples.

Figure 1:
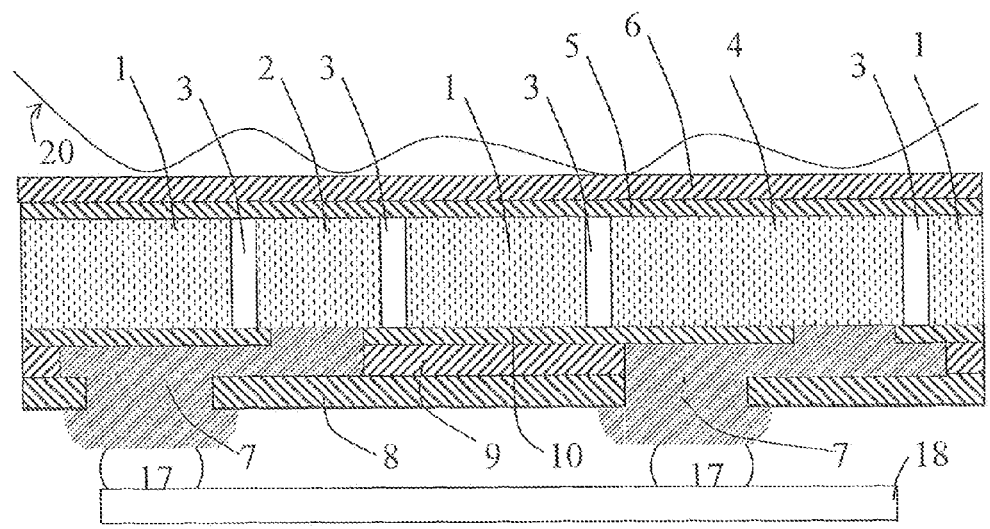
FIG. 1 illustrates the cross section of a preferred embodiment of the invention.

FIG. 1 illustrates the cross section of the preferred embodiment of the fingerprint sensor according to the invention. Primarily the sensor is constituted by a semiconductor substrate 1 with first conducting leads 2 as a through-die via in the substrate. The first conductor leads are produced for example as described in WO2007/089207 by etching a trench in the doped substrate material, filling the trench with an insulating material 3 and then removing the rest of the substrate so that the trenches go through the substrate and electrically insulates the surrounded area 2 from the rest of the substrate 1. Additional doping can be added to the via and/or the surrounding substrate e.g to improve the contact resistance and/or to add diodes for ESD protection.

The size of the first conductors 2 are chosen so that they are smaller than structures in a typical finger surface 20 so that they are capable of distinguishing between valleys and ridges in the surface which typically have a pitch of approximately 300-600 µm. A typical cross section of the first conductors may therefore be approximately 20-50 µm while the width of the insulating trench is 1-30 µm, but other versions may be contemplated, e.g. with larger sensor pitch in the range of 100 µm. In a realized embodiment the sensor pitch is 50.8 µm.

The preferred embodiment of the invention is aimed at impedance measurements at or in the finger surface and thus the sensing side of the substrate surface is provided with a first dielectric layer 5 and preferably a protecting layer 6. The protecting layer may be made from a carbon based materials such as Diamond Like carbon (DLC) or amorphous diamond, as described in EP0779497 and U.S. Pat. No. 5,963,679. The thickness of the dielectric and protecting layer being chosen so as to provide suitable impedance for the measurement, for example in the range of 500 nm or more.

On the opposite side from the sensing surface the fingerprint sensor is in a per se known way provided with routing conductor leads 7 and dielectric layers 8,9,10 for adapting to the positions of contact electrodes 17 on the processing unit

18 to be coupled to the fingerprint sensor. As the processing unit 18 is made independently it can be made much smaller than the substrate and using processing solutions that are more efficient and less expensive than solutions making the circuitry in the substrate.

According to the preferred embodiment the substrate is also provided with a second through going conductor 4 being produced in the same way as the first conductor leads 2 but having larger dimensions so as to be significantly larger than the features in the finger surface and thus the coupling between the second conductor and the finger is not significantly affected by the structure in the surface. In this case the processing unit is adapted to measure the impedance between each of a multitude of sensor elements provided by the first conductor leads 2 and drive electrode provided by a second conductor lead 4 as the processing unit also applies a static or varying voltage between the first and second conductor leads and measures the impedance in a per se known way, e.g. by applying a voltage between the second conductor and ground, the impedance between the first and second conductors being measured by sensing the current flow from the finger into ground at the first conductor. Due to the differences in size only the structures of the finger close to the first conductor leads will affect the measurements and thus be measured by the sensor. In this embodiment of the invention it is also possible to provide openings or thinner parts in the second dielectric layer 5 in order to optimize the impedance between the finger and the sensor pads 2, drive pads 4 and/or the remainder of the substrate 1.

Other alternatives may also be contemplated, e.g. with a third conductor (not shown) close to the first conductor leads and with a comparable size such as the solution described in U.S. Pat. No. 6,512,381.

Figure 2:
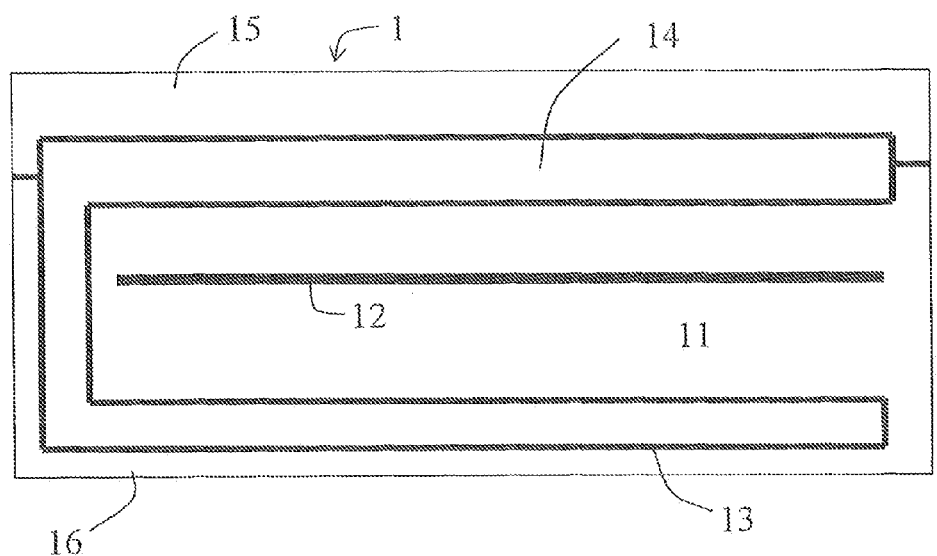
FIG. 2 illustrates a linear fingerprint sensor layout as seen from above.

FIG. 2 illustrates the layout of a stripe shaped fingerprint sensor 11 constituted by an essentially linear array of sensor elements 12 wherein each sensor element is related to one first conductor lead 2. Essentially encircling the sensor array 12 is a stimulation or drive electrode 14 related to the second conductor lead, thus ensuring a uniform voltage distribution over the finger and the impedance differences sensed in the sensor array being related to the structure variations in the skin close to the array.

The layout in FIG. 2 also includes two ground electrodes 15,16, e.g. for digital and analog ground coupling, thus also providing ESD protection. These electrodes may also be related to corresponding conductor leads through the substrate or, as is illustrated with one of the ground electrodes 16 be provided through the substrate itself. The dielectric layer on top of the ground electrodes may be thinned or removed to increase the probability of ESD events to discharge to ground. Other solutions for providing ESD protection may be realized by doping of diode structures in substrate vias or in sensor substrate and with external ESD protection by connecting an external ESD diode between the drive electrode and ground, for instance by flip-chip assembly.

According to an alternative embodiment of the sensor layout illustrated in FIG. 2 the sensor line may be constituted by several lines of sensor elements, possibly shifted in the longitudinal direction providing a staggered structure and improving the resolution in the measurements. A number of sensor lines may also allow for reconstructing a fingerprint image by stitching as described in U.S. Pat. No. 6,289,114 or for measuring the movement of the finger over the sensor as described in U.S. Pat. No. 7,054,471.

According to an alternative embodiment the ground and/or drive/stimulation electrodes may be provided through external electrodes outside the substrate, with the advantage of reducing the substrate material area as discussed in U.S. Pat. No. 6,628,812 and U.S. Pat. No. 6,683,971.

Additional electrodes and circuitry may be provided on the sensor surface 11, for example for measuring the movement of the finger over the surface, as described in U.S. Pat. No. 7,251,351 and U.S. Pat. No. 7,110,577, or for navigation or driving a pointer on a screen, as described in U.S. Pat. No. 7,129,926 and U.S. Pat. No. 7,308,121. The trenches may also be used for isolating sections of the substrate for other purposes, e.g. for other types of circuitry not related to the fingerprint sensor.

Figure 3:
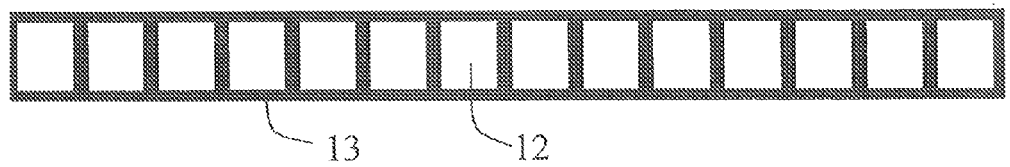
FIG. 3 illustrates the preferred structure of the insulating area between the drive electrodes or ground electrodes and the substrate.

As illustrated in FIG. 1 the insulation between the electrodes and substrate may be provided using a trench in the substrate filled with an insulating material 3, preferably a dielectric material. In FIG. 3 an alternative solution is illustrated in which a double trench 12,13 is used being constituted by a two trenches being interconnected through trenches stretching between them at chosen intervals, thus providing a ladder like shape. This has the advantage that errors in the production will not lead to direct connections from one side of the ladder to the other, but only cross one trench e.g. from one side of the ladder to one of the islands 12 isolated in the ladder, or between the islands, and also it gives less coupling capacitance over the insulator and better insulation. This double trench is the preferred solution especially between the drive/stimulation electrode 14 and the ground electrodes. In practice the linear array will also have essentially this structure using the islands 12 as sensors, possibly with additional sensors positioned on one or both sides of the ladder. The ladder trench dimensions may be consist of vias in the range of 20-50 μm separated by trenches having a width of 1-30 μm, for example with a pitch of 50.8 μm. The ladder trenches are per se known from a publication by Silex, the applicants in above-mentioned WO2007/089207, in the article by Tomas Bauer: "First High Volume Via Process for packaging and Integration of MEMS/CMOS", published on their web site.

Figure 4:
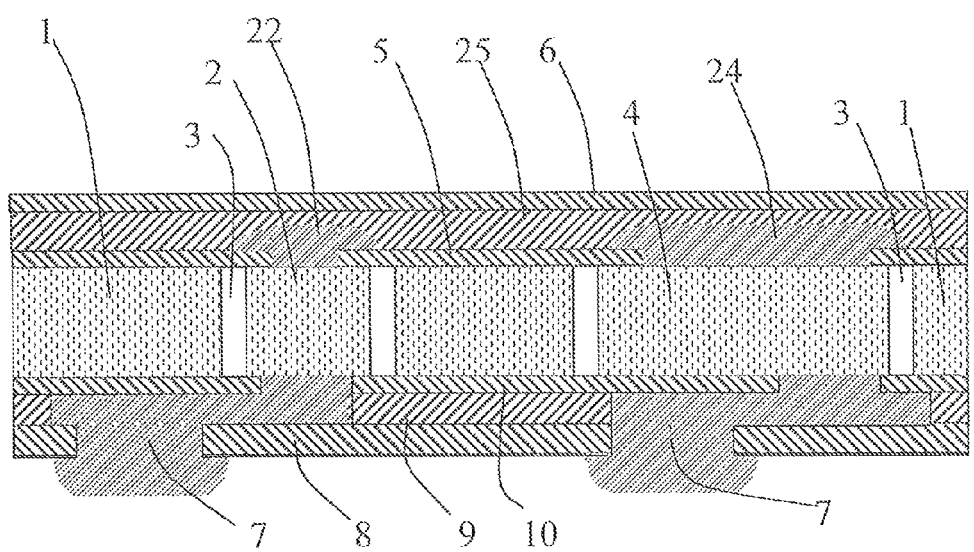
FIG. 4 illustrates the cross section of an alternative embodiment of the invention.

In FIG. 4 a similar solution to the embodiment in FIG. 1 is illustrated. In this case openings in the sensor side first dielectric layer 5 are provided over the conductor leads 2,4 and sensor pad metallization 22,24 is provided in the openings. A second dielectric layer 25 is provided covering the metal sensor pads 22,24 and the protective layer 6 is provided on top. The metal sensor pads 22,24 improves the coupling and increases the freedom of defining the sensor area as this is defined in the metal process not in the via process. However there is a trade-off between the electrode (sensor 22 and stimulus/drive 24) areas as if the sensor area extends over the dimensions of the underlying conductor leads 2,4 and insulating trenches 3 this will affect impedance over the sensor element or drive electrode through coupling to the surrounding substrate. This gives the possibility to have different thicknesses in the dielectric layer at the sensor and/or stimulus pads than at the rest of the surface, which may improve the coupling of the signal between the sensor pads 22 and the stimulus pads 24. In this embodiment of the invention it is also possible to provide openings or thinner parts in the second dielectric layer 25 over the sensor pads constituting the drive pad 24 or sensor element pads 22 in order to optimize the impedance over the sensor pads, drive pads and the rest of the substrate.

Figure 5:
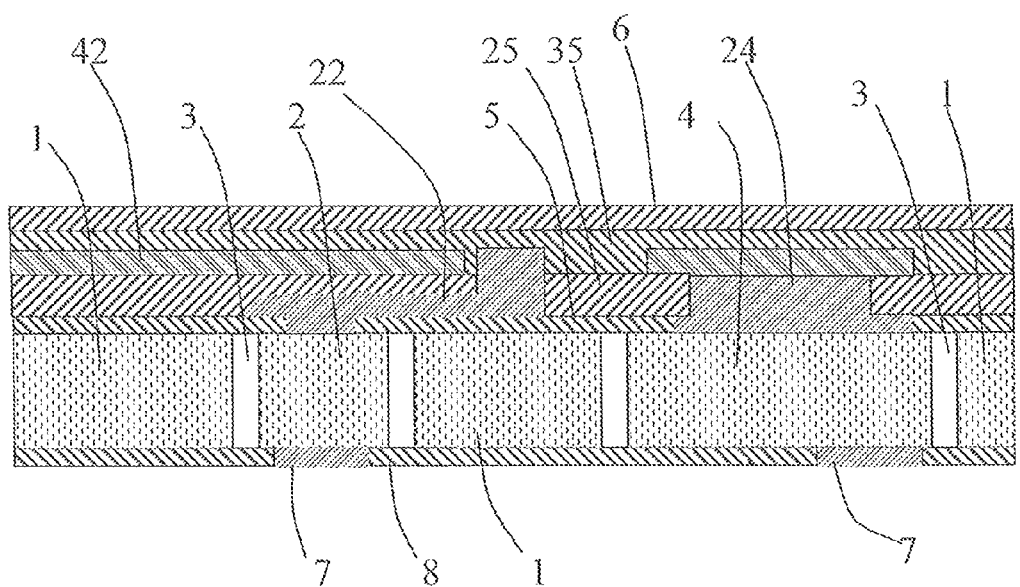
FIG. 5 illustrates the cross section of a third embodiment of the invention.

In FIG. 5 the positions of the conductor leads have been chosen so as to connect directly to the processing unit and is only provided with a first second side dielectric layer 8 with metal filled openings 7 at the conductors for coupling to the processing unit. A combination of the embodiments shown in FIGS. 4 and 5 may also be contemplated using conductor routings in both the upper and lower surfaces of the substrate, thus routing the conductor lead on both sides.

On the upper, first side of the substrate 1 in FIG. 5 the positions of the sensor elements are adjusted in the same way as the connection points under the substrate are routed using conducting and dielectric layers 8,9,10 under the substrate in FIG. 4. Openings are provided in the first dielectric layer 5 and a first metal layer is provided constituting a pattern of metal conductor leads 22, 24 from the through going vias/conductor leads to the predetermined positions on the sensor surface. The first metal layer 22, 24 is covered by a second dielectric layer 25 with openings at the predetermined positions of the sensor elements and electrodes on the sensor surface and a second metal layer is provided at the sensor elements and electrode positions as well as constituting a shielding layer 42 over the sensor. In top of this the upper dielectric layer 35 and protecting layer 6 is applied.

The advantage provided by the solution illustrated in the upper part of FIG. 5 is that the routing of the electrode allows for a smaller pitch between the sensor elements than the described production method for the conductor leads through the substrate. Thus an improved spatial resolution of the resulting fingerprint image may be obtained.

Thus the invention refer especially to the realization of fingerprint sensors with sensor vias and preferably also drive electrode vias as part of the substrate. The preferred sensor is covered by an integrated diamond-like protection coating and has a ladder structure in sensor line and drive isolation trench, and also possibly separating different parts of the sensor substrate for use in different functionalities. This results in a fingerprint sensor with a planar surface being possible to position in the same plane as the surface into which it is mounted. Using flip-chip assembly or similar a possibility for on-chip assembly of electronic ASIC is provided.

In addition to fingerprint sensors the invention may also be utilized in other areas for measuring surface structures, such as bank notes or items with hidden information in the surface structure.

To summarize the invention relates to a sensor for measuring structures in a surface, especially a fingerprint sensor, comprising a chosen number of sensor elements at chosen positions for coupling to a surface having a size less or comparable to the size of the structures in the surface, and a processing unit including interrogation electrodes coupled to said sensor elements for providing impedance measurements at said surface structures, the processing unit being mounted on one side of a substrate and the sensor elements being positioned on the opposite side of said substrate, the substrate including through going first conducting leads between said sensor elements and said interrogation electrodes. The substrate is made from a semiconductor material such as silicon and said first conducting leads are constituted by through going substrate sections of a chosen size surrounded by an insulating material, preferably a dielectric separating them from the substrate. Thus the sensor may be produced from a single wafer having interrogating processing unit on the opposite side from the measuring surface.

The substrate also includes at least one second conductor lead the cross section in the direction through the substrate being substantially larger than the structures of the surface, providing an external electrode being coupled to said finger surface and to said processing unit. The second conductor lead also being constituted by a section of the substrate being insulated from the substrate with a dielectric material and being positioned either on one side of the sensor elements or surrounding them. The processing unit is preferably adapted to measure the impedance between the external electrode and the sensor elements, and the sensor elements are grouped in a limited area of said substrate and said at least one second conductor lead is positioned in the plane at least two sides of said limited area, thus at least partially encircling the limited area with the sensor elements. At least one second conductor leads may be coupled to ground as a reference potential.

For protecting the outer surface against wear an outer protecting layer made from a carbon based material, e.g. amourphous diamond or DLC, covering said sensor elements and protecting the sensor surface.

The sensor pads may be constituted by conductive areas coupled to the associated conductor extending outside the dimension of the conductor leads, but in order to reducecross talk and capacitive coupling to the substrate the dimensions of the conductor leads with surrounding dielectric insulation is preferably less than the dimensions of the conductor leads and related insulating material.

The sensor elements may be positioned in a predetermined area of the substrate surface, the sensor elements being essentially surrounded by a drive electrode, said drive electrode being coupled to said processing unit being adapted to apply a varying voltage between the drive electrode and ground, and measuring the impedance between the sensor elements and the drive electrode. More specifically the drive electrode may be coupled to the processing unit through second conductor leads in the substrate being electrically insulated from the substrate, the insulation being an insulation structure constituted by two through going essentially parallel dielectric regions, the insulation structure having through going dielectric regions extending between each parallel dielectric regions at chosen intervals, thus providing a double insulation region. The sensor may also comprise at least one ground electrode.

The preferred embodiment of the invention is especially related to a surface sensor where the sensor elements constitute an essentially linear array for measuring the structures in a portion of the finger surface, said essentially linear array comprising at least one line of sensor elements. The sensor thus being a stripe sensor for measuring structures of a surface, especially a finger, being moved relative to the surface. The processing unit or related circuitry may then combine the measurements from said sensor elements sampled at different time periods for providing an image of the surface.

The sensor elements in the stripe sensor may then be arranged in different ways, such as a number of parallel sensor lines providing a possibility for creating an image of the complete surface by stitching. The sensor lines may also be shifted in the longitudinal direction, thus providing staggered lines improving the resolution in the resulting image.

The sensor may also comprise sensor elements for measuring the movement of the surface being moved relative to the surface in a per se known way. These sensor elements either being constituted by a chosen number of the sensor elements or specially provided and positions movement sensors.

The invention claimed is:
1. A fingerprint sensor for measuring surface structures, the fingerprint sensor comprising:
   a chosen number of sensor elements at chosen positions for coupling to a surface having a size less or comparable to a size of the surface structures;
   a processing unit comprising interrogation electrodes coupled to said sensor elements for providing impedance measurements at said surface structures, the processing unit being mounted on one side of a substrate and the sensor elements being positioned on an opposite side of said substrate;

the substrate comprising:
- through going first conducting leads between said sensor elements and said interrogation electrodes;
- wherein the substrate is made from a semiconductor material;
- wherein said first conducting leads are constituted by through going substrate sections of a chosen size surrounded by an insulating material;
- wherein the first conducting leads are made from identical material as the substrate; and
- wherein the substrate comprises at least one second conductor lead, the at least one second conductor lead being constituted by a section of the substrate being insulated from the substrate with a dielectric material; and an external electrode being coupled to a finger surface and to said processing unit through said at least one second conductor lead, the external electrode being substantially larger that the surface structures.

2. The fingerprint sensor according to claim 1, wherein said at least one second conductor lead comprises a cross section in a direction through the substrate, the cross section being substantially larger than the surface structures.

3. The fingerprint sensor according to claim 2, wherein the processing unit measures the impedance between the external electrode and the sensor elements.

4. The fingerprint sensor according to claim 3, wherein the sensor elements are grouped in a limited area of said substrate and said at least one second conductor lead is positioned in a plane on at least two sides of said limited area wherein the at least one second conductor lead partially encircles the limited area with the sensor elements.

5. The fingerprint sensor according to claim 2, wherein said at least one second conductor lead is coupled to ground.

6. The fingerprint sensor according to claim 1, comprising:
- a dielectric layer covering the side of the substrate on which the sensor elements are positioned and having openings on areas having reduced thickness over the sensor elements; and
- a conductive layer positioned at least in said openings constituting sensor pads.

7. The fingerprint sensor according to claim 6, wherein dimensions of the sensor pads are substantially similar to cross section dimensions of the conductor leads with surrounding dielectric insulation.

8. The fingerprint sensor according to claim 1 comprising an outer protecting layer made from a carbon based material, the outer protective layer covering said sensor elements and protecting a sensor surface.

9. The fingerprint sensor according to claim 1, wherein said sensor elements are position in a predetermined area of a substrate surface, the sensor elements being surrounded by a drive electrode, said drive electrode being coupled to said processing unit for applying a varying voltage between the drive electrode and ground, and measuring the impedance between the sensor elements and the drive electrode.

10. The fingerprint sensor according to claim 9, wherein the drive electrode is coupled to the processing unit through the at least one second conductor lead in the substrate and is electrically insulated from the substrate, the insulation being an insulation structure constituted by two through going essentially parallel dielectric regions, the insulation structure having through going dielectric regions extending between each parallel dielectric regions at chosen intervals for providing a double insulation region.

11. The fingerprint sensor according to claim 9, wherein the sensor elements constitute a linear sensor array for measuring the surface structures in a portion of the finger surface, said linear sensor array comprising at least one line of sensor elements.

12. The fingerprint sensor according to claim 11, wherein said linear sensor array comprises a number of parallel lines of sensor elements.

13. The fingerprint sensor according to claim 12, wherein said parallel lines of sensor elements are shifted a chosen distance relative to each other for providing staggered lines of sensor elements.

14. The fingerprint sensor according to claim 11, comprising at least two movement sensor elements positioned at a chosen distance from each other for measuring a movement of said surface over said sensor.

15. The fingerprint sensor according to claim 14, wherein at least one of said at least two movement sensor elements is constituted by a sensor element in said linear sensor array.

16. The fingerprint sensor according to claim 10, further comprising at least one ground electrode.

17. The fingerprint sensor according to claim 1, wherein said substrate comprises at least one second conductor coupled to the external electrode outside the substrate and being substantially larger than the surface structures.

18. The fingerprint sensor according to claim 1, wherein the semiconductor material comprises silicon.

19. The fingerprint sensor according to claim 1, wherein the insulating material comprises a dielectric separating the first conducting leads from the substrate.

* * * * *

UNITED STATES PATENT AND TRADEMARK OFFICE
CERTIFICATE OF CORRECTION

PATENT NO. : 8,487,624 B2
APPLICATION NO. : 13/060759
DATED : July 16, 2013
INVENTOR(S) : Bredholt et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 338 days.

Signed and Sealed this
Seventh Day of April, 2015

Michelle K. Lee
*Director of the United States Patent and Trademark Office*